United States Patent [19]

Chun

[11] Patent Number: 5,352,852

[45] Date of Patent: Oct. 4, 1994

[54] CHARGE COUPLED DEVICE PACKAGE WITH GLASS LID

[75] Inventor: Heung S. Chun, Seoul, Rep. of Korea

[73] Assignee: Goldstar Electron Co., Ltd., Choongchungbook-do, Rep. of Korea

[21] Appl. No.: 101,030

[22] Filed: Aug. 3, 1993

[30] Foreign Application Priority Data

Aug. 28, 1992 [KR] Rep. of Korea ............... 15607/1992

[51] Int. Cl.⁵ ........................... H02G 3/08; H05K 5/00
[52] U.S. Cl. ............... 174/52.4; 174/35 GC; 257/680
[58] Field of Search .............. 174/52.4, 35 GC; 257/676, 678, 680, 684, 688, 692, 694

[56] References Cited

U.S. PATENT DOCUMENTS 4,760,440  7/1988  Bigler et al. .
4,855,808  8/1989  Tower et al. .................... 174/52.4

FOREIGN PATENT DOCUMENTS 6454979  8/1987  Japan .

*Primary Examiner*—Lincoln Donovan
*Attorney, Agent, or Firm*—Birch, Stewart, Kolasch & Birch

[57] ABSTRACT

A charge coupled device package with a glass lid is provided. The package includes a charge coupled device having a plurality of conductive bumps on its bond pads, an insulating tape bonded to the inside of the conductive bumps on the charge coupled device, a plurality of metal lines each connected at an end thereof to each of the conductive bumps and at the outer end thereof to a signal terminal of a circuit board and adapted for transmitting an electric signal of the charge coupled device to the outside, and a glass lid provided with the plurality of metal lines on opposite sides of its lower surface and bonded to an upper surface of the insulating tape on the charge coupled device. The sealing part of a sealing resin is provided between a lower periphery of the glass lid and an upper surface of the charge coupled device. This charge coupled device package reduces the package weight as well as the package thickness and thus achieves the recent trend of lightness and compactness of an integrated camera and video cassette recorder system.

8 Claims, 3 Drawing Sheets

CHARGE COUPLED DEVICE PACKAGE WITH GLASS LID

BACKGROUND OF THE INVENTION

1. Field of the Invention

The present invention relates in general to a charge coupled device package used in electric equipment, such as an integrated camera and video cassette system, and more particularly to a charge coupled device package with a glass lid, which is covered with and sealed by the glass lid which lid is capable of transmitting an image light to a light reception part of a charge coupled device.

2. Description of the Related Art

With reference to FIG. 1, there is shown a known charge coupled device package with a glass lid where the glass lid of a predetermined size covers and seals a charge coupled device, Here, as well known to those skilled in the art, the charge coupled device is used to convert an image light into an electric signal. The known charge coupled device package with a glass lid (hereinafter, referred to simply as "the glass lid type CCD package") includes a ceramic package having a ceramic body or a package body 4 provided with a cavity 4a of a predetermined diameter and a predetermined depth. In order to manufacture the ceramic package, a plurality of metal lines or lead fingers 5 are arranged on the package body 4 at opposite sides of the cavity 4a such that the lead fingers 5 are spaced apart from each other by a predetermined interval. Thereafter, a ceramic layer, having a predetermined thickness and a predetermined width, is applied on the lead fingers 5 on each of the sides of the package body 4 prior to burning the package body 4.

A plurality of outleads 6 are connected to outer ends of individual lead fingers 5. The outleads 6 are also connected to the opposite side walls of the package body 4 through bra-Ting metals 6' respectively. The charge coupled device 1 (hereinafter, referred to simply as "the CCD"), having a light reception part 1a on its upper center, is bonded to the upper center of the cavity 4a of the CCD package body 4. The CCD 1 is also provided on its opposite sides with a plurality of bond pads 2, each of which is connected to an inner end of each of the lead fingers 5 by a metal wire 3. The package body 4 is covered with and sealed by a glass lid 7 through which an outside image light is transmitted to the light reception part 1a of the CCD 1.

In order to bond the glass lid 7 to the package body 4, a bonding agent having a lower melting point is conventionally used.

In application, the known glass lid type CCD package is mounted on a circuit board (not shown) such that the outleads 6 of the package are connected to signal terminals of a signal processing circuit (not shown) of the circuit board and conventionally used as an optical element of electronic equipment, particularly of an integrated camera and video cassette recorder system, a so-called camcorder. In operation, the optical image light from the camera lens is transmitted through the glass lid 7 and received by the light reception part 1a of the CCD 1. Upon reception of the image light, the CCD 1 converts the image light into an appropriate electric signal which is in turn outputted to the signal processing circuit through the bond pads 2 of the CCD 1, the metal wires 3, the lead fingers 5 and the outleads 6 in this order.

In the drawing, the reference numeral 9 denotes a bonding part for bonding the CCD 1 to the bottom surface of the cavity 4a of the package body 4.

Turning to FIG. 2, there is shown a flowchart of a process for manufacturing the known glass lid type CCD package. In order to manufacture the known glass lid type CCD package, a wafer forming step 110 of the ceramic package body 4 is first carried out. The package body 4 is formed such that it has the cavity 4a on its upper surface. The plurality of lead fingers 5 are, thereafter, arranged on the package body 4 at the opposite sides of the cavity 4a and applied with the ceramic layer, having the predetermined thickness and the predetermined width, thereby producing the package body 4. This package body forming step is followed by a die attaching step 130 wherein the CCD 1, prepared by the step 120 of sawing the wafer, is bonded to the center of the bottom surface of the cavity 4a of the package body 4. Thereafter, the plurality of the bond pads 2 of the CCD 1 are connected to the inner ends of the lead fingers 5 through the metal wires 3, respectively, thereby accomplishing a wire bonding step 140. The wire bonding step 140 is followed by a glass lid sealing step 150 wherein the glass lid 7 is bonded to the upper surface of the package body 4 to seal the cavity 4a. The process for manufacturing the glass lid type CCD package further includes a trimming step 160 and a marking step 170 which are performed in this order after the glass lid sealing step 150. Here, a green tape forming and a screen printing are carried out in this order to arrange the lead fingers 5 on the package body 4.

As noted from the above description, in manufacturing the known glass lid type CCD package, it is required to form the package body using the ceramic material while arranging the plurality of metal lines or the lead fingers on predetermined positions of the package body. Also, the plurality of outlands should be bonded to the opposite side walls of the package body and connected to the outer ends of the lead fingers after the burning of the package body, respectively. Thus, the known glass lid type CCD package has a problem in that it requires a complex manufacturing process, involves a larger capital investment and requires a longer manufacturing time, so that it is not suitable for mass production.

In addition, the known glass lid type CCD package requires a critical cleanness control in its manufacturing process since it has the CCD, adapted for converting the image light into the electric signal, thereby requiring good care in assembling the semiconductor device. Another problem of the known glass lid type CCD package is that it does not achieve the recent trend of compactness of the semiconductor device. Furthermore, the known glass lid type CCD package is limited in reducing a lead pitch (presently reduced to 50 mil) of its outleads, thereby providing no semiconductor device having a fine pitch.

SUMMARY OF THE INVENTION

It is, therefore, an object of the present invention to provide a charge coupled device package with a glass lid in which the aforementioned problems can be overcome wherein the recent trend of compactness is achieved and its manufacturing process is simplified and is, thereby suitable for mass production.

It is another object of the present invention to provide a charge coupled device package with a glass lid which remarkably reduces the lead pitch of its outleads, thereby providing a semiconductor device having a fine pitch.

To accomplish the above objects, a charge coupled device package with a glass lid in accordance with an embodiment of the present invention comprises: a charge coupled device, provided with a plurality of conductive bumps on its individual bond pads; an insulating tape, having a predetermined thickness and a predetermined width and bonded to the inside of the conductive bumps on the charge coupled device; a plurality of metal lines, each connected at an end thereof to each of the conductive bumps and at the other end thereof to a signal terminal of a circuit board and adapted for transmitting an electric signal of the charge coupled device to the outside therethrough; and a glass lid, provided on opposite sides of its lower surface with the plurality of metal lines and mounted above the charge coupled device, and bonded to the upper surface of the insulating tape.

The above charge coupled device package with a glass lid is manufactured by a process comprising the steps of: forming a conductive bump on each of the plurality of bond pads of the charge coupled device; bonding a double-faced insulating tape, having a window frame shape and of a predetermined thickness and a predetermined width, to the inside of the conductive bumps; bonding a glass lid, provided with a plurality of metal lines on opposite sides of its lower surface, to an upper surface of the insulating tape; and electrically connecting end of each of the metal lines to each of the conductive bumps; and encapsulating the charge coupled device by applying a sealing resin to a gap between the lower periphery of the glass lid and the upper surface of the charge coupled device.

Thereafter, the circuit board, on which the charge coupled device package of the present invention is to be mounted, is formed with a mounting depression at a predetermined position. The charge coupled device package is inserted into the mounting depression, and thereafter, the outer ends of the metal lines, exposed to the outside from the lower surface of the glass lid, are electrically connected to signal terminals of the circuit board, respectively, thereby achieving the mounting of the charge coupled device package on the circuit board.

In operation, an optical image light from a camera lens is transmitted through the glass lid and received by a light reception part of the charge coupled device of the package. Upon reception of the image light, the charge coupled device converts the image light into an appropriate electric signal which is in turn outputted to a signal processing circuit of the circuit board through the bond pads of the charge coupled device, the conductive bumps, and the metal lines under the glass lid in this order.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
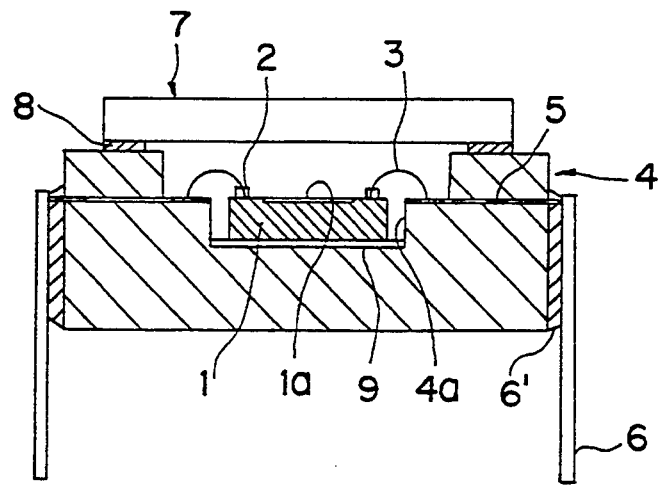
FIG. 1 is a cross-sectional view showing a construction of a charge coupled device package with a glass lid according to the conventional art.
Figure 2:
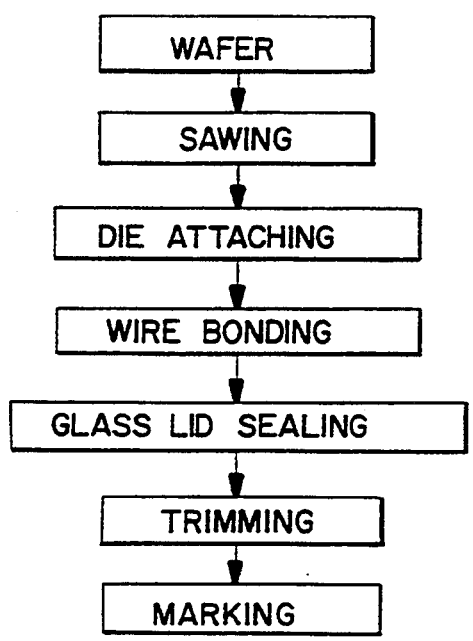
FIG. 2 is a flowchart of a process for manufacture of the conventional charge coupled device package with a glass lid.
Figure 3A:
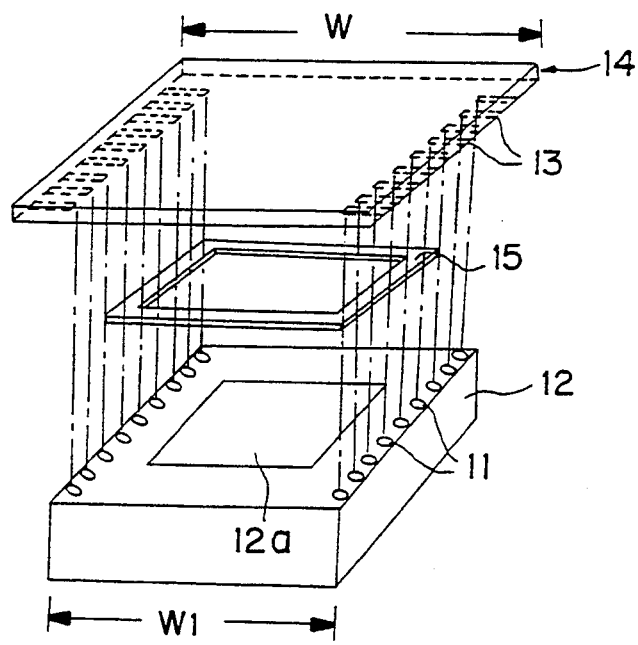
FIG. 3A is an exploded perspective view showing a construction of a charge coupled device package with a glass lid according to an embodiment of the present invention.
Figure 3B:
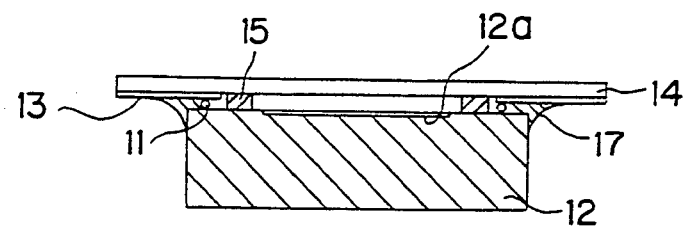
FIG. 3B is a cross-sectional view of the charge coupled device package of FIG. 3A after assembled.
Figure 4:
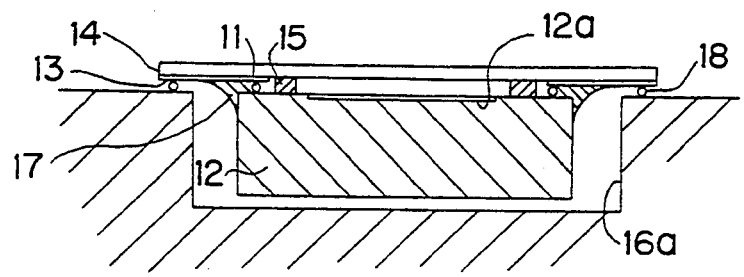
FIG. 4 is a cross-sectional view showing the charge coupled device package of FIG. 3B, mounted on a circuit board while being inserted in a mounting depression of the circuit board.
Figure 5:
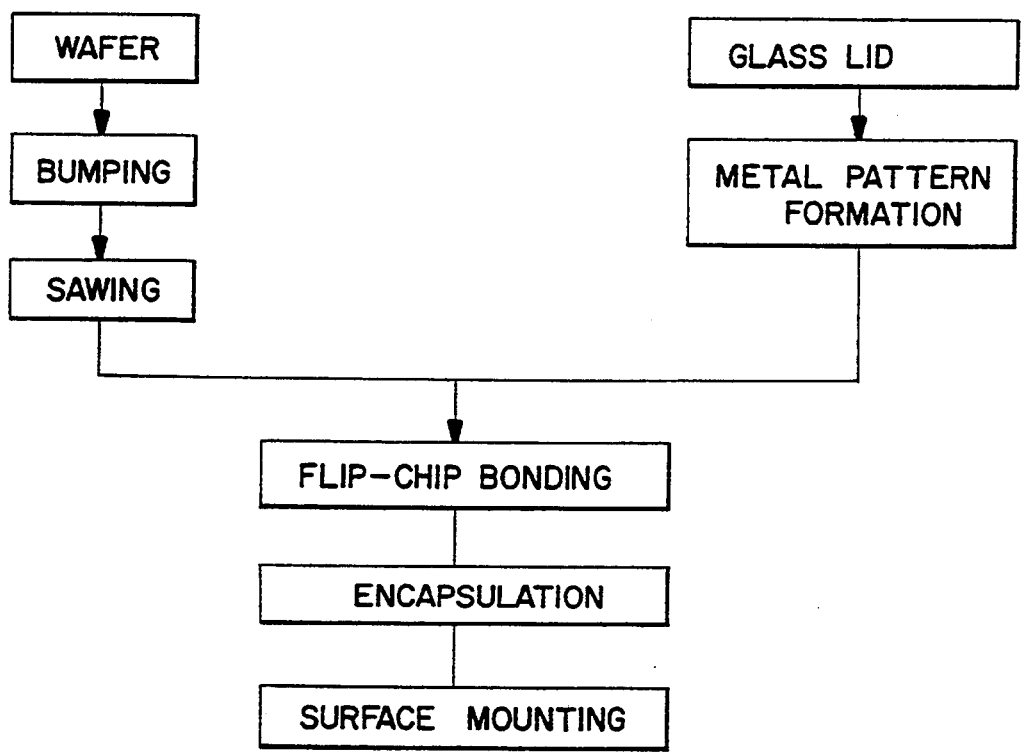
FIG. 5 is a flowchart showing a process for manufacture and surface mounting of the charge coupled device package with the glass lid for an embodiment of the present invention.

With reference to the drawings, FIGS. 3A and 3B show a charge coupled device package with a glass lid in accordance with an embodiment of the present invention, FIG. 4 shows the charge coupled device package mounted on a circuit board having a mounting depression, and FIG. 5 is a flowchart of a process for manufacture of the charge coupled device package for an embodiment of the present invention. The charge coupled device package with the glass lid (hereinafter, referred to simply as "the glass lid type CCD package") includes a charge coupled device 12, which has a width $W_1$ and is provided with a conductive bump 11 on each of its bond pads. A window frame-shaped and double-faced insulating tape 15, having a predetermined thickness and a predetermined width, is bonded to the inside of the plurality of conductive bumps 11 on the charge coupled device 12. The glass lid type CCD package further includes a plurality of metal lines 13, each connected at an end thereof to each of the conductive bumps 11 and at the other end thereof to a signal terminal of a circuit board 16 and adapted for transmitting an electric signal of the charge coupled device 12 to the outside therethrough. In addition, a glass lid 14 is mounted above the charge coupled device 12. The glass lid 14 is provided at opposite sides of its lower surface with the plurality of metal lines 13 and is bonded to the upper surface of the insulating tape 15.

Here, each of the conductive bumps 11, preferably made of gold or solder showing an excellent conductivity, is positioned on each of the bond pads (not shown) of the charge coupled device 12 (hereinafter, referred to simply as "the CCD") and has a predetermined height.

In addition, tile metal lines 13 are arranged under the opposite sides of the glass lid 12 such that they are spaced apart from each other in the same manner as and by the same interval as the conductive bumps 11. The glass 1 id 14 has a width W, which is larger than that $W_1$ of the CCD 12, so that all of the free ends of the metal lines 13 provided under the glass lid 14 are exposed to the outside of the opposite sides of the CCD 12. The mounting of the glass lid type CCD package is achieved by mounting the metal lines 13 on the circuit board 16. In mounting the glass lid type CCD package on the circuit board 16, each of the metal lines 13 is soldered to a signal terminal (not shown) of the circuit board 16. In order to prevent reflection of the light by the glass lid 14, the glass lid 14 is applied with an anti-reflection coating or an anti-reflection tape on its upper surface.

The insulating tape 15 is adapted for spacing the glass lid 14 from the CCD 12 by a predetermined interval and uses a window frame-shaped tape which is sized to cover neither the conductive bumps 11 of the CCD 12 nor the metal lines 13 of the glass lid 14.

In order to improve the sealing performance of the glass lid type CCD package, an encapsulation of the charge coupled device 12 is carried out. Otherwise stated, a sealing resin is applied to a gap between the lower periphery of the glass lid 14 and upper surface of the CCD 12, thereby improving the sealing performance between the glass lid 14 and the CCD 12 as well as the reliability of the CCD package.

In the drawings, the reference numeral 16a denotes a mounting depression of the circuit board 16 for mounting the glass lid type CCD package on the circuit board 16.

Turning to FIG. 5, there is shown a flowchart of a process for manufacture of the above glass lid type CCD package. At first, a wafer is provided at step 210, and a plurality of conductive bumps 11 are formed on the plurality of bond pads of the wafer, respectively at step 220. The wafer is, thereafter, divided into a plurality of CCDs 12 by sawing at seep 230. The doublefaced insulating tape 15, having the predetermined thickness and the predetermined width, is bonded to the inside of the bond pads 12 of each of the divided CCDs 12. The glass lid 14, having a surface area slightly larger than the upper surface area of the CCD 12, is provided on opposite sides of its lower surface with the plurality of metal lines 13 at step 240. The glass lid 14 is, thereafter, arranged on the CCD 12 such that the plurality of metal lines 13 are aligned with the plurality of conductive bumps 11 of the CCD 12, respectively at step 250. The glass lid 14 is in turn bonded to the upper surface of the insulating tape 15 on the CCD 12 such that there is provided a predetermined space between the glass lid 14 and the light reception part 12a of the CCD 12. In addition, a flip-chip bonding at step 260 is carried out.

Here, the bonding of the metal lines 13 of the glass lid 14 to the conductive bumps 11 of the CCD 12 is preferably achieved by a local heating method employing hot air or by a reflow method.

The flip-chip bonding is followed by an encapsulation at step 270 wherein the sealing resin 17 is applied to the gap between the lower periphery of the glass lid 14 are exposed to the outside. As a result, the glass lid type CCD package of FIG. 3B is produced.

In order to mount the glass lid CCD package on the surface of the circuit board 16, the circuit board 16 is provided with the mounting depression 16a into which the CCD package is inserted. Thereafter, the metal lines 13 of the CCD package are bonded to the signal terminals (not shown) of the circuit board 16, respectively, thereby accomplishing the surface mounting at step 260 of the CCD package on the circuit board 16.

In operation, the image light from the camera lens (not shown) is transmitted to the light reception part 12a of the CCD 12 through the glass lid 14. Upon reception of the image light, the CCD 12 converts the image light into the electric signal which is in turn outputted to the signal terminals of the circuit board 16 through the conductive bumps 11 and the metal lines 13.

Figure 6:
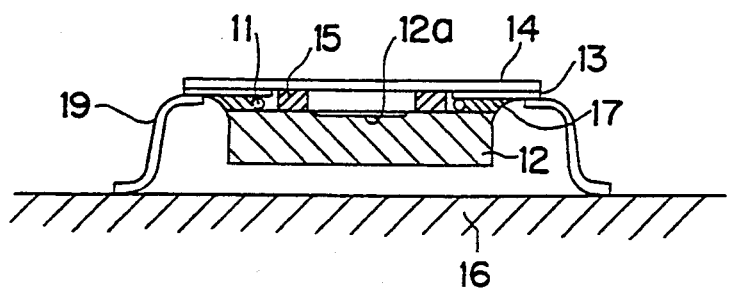
FIG. 6 is a cross-sectional view showing a charge coupled device package with a glass lid in accordance with another embodiment of the present invention, mounted on a circuit board without a mounting depression.

FIG. 6 shows a second embodiment of a glass lid type CCD package of the present invention which is mounted on the circuit board 16 in accordance with another type of surface mounting. In this second embodiment, the glass lid type CCD package is provided with an additional outlead 19, which is adapted for signal communication and connected to an outer end of each of the metal lines 13 of the glass lid 14. The CCD package is mounted on the surface of the circuit board 16 through the additional outleads 19. Each of the outleads 19 is preferably made of copper or Fe-Ni alloy and preferably bent in the shape as shown in FIG. 6. However, each of the outleads 19 may be bent in the shape of other forms, including a gull-form, other than the aforementioned.

This second embodiment of CCD package is simply mounted on the circuit board 16 by bonding the outer ends of the outleads 19 to a plane surface of the circuit board 16. Thus, this CCD package requires no depression 16a to be formed on the circuit board differently from the primary embodiment of FIG. 4, so that it has an advantage of using a conventional plane circuit board.

In the second embodiment, the general shape and the operational effect of the CCD package except for addition of the outleads 19 remain the same as in the primary embodiment and those elements common to both the primary embodiment and the second embodiment thus carry the same reference numerals, and further explanation is not deemed necessary.

As described above, the present invention provides a CCD package with a glass lid which requires no conventional ceramic package and has a simple construction, thereby simplifying the manufacturing process, reducing the manufacturing cost, and improving the productivity. The CCD package according to the present invention achieves compactness, particularly owing to a remarkable reduction of package weight and package thickness. Hence, the CCD package of the present invention achieves the recent trend of lightness and compactness of electronic and information equipment employing semiconductor devices, such as an integrated camera and video cassette recorder system.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A charge coupled device package with a glass lid comprising:
   a charge coupled device having a plurality of conductive bumps on bond pads of said charge coupled device;
   an insulating tape having a predetermined thickness and a predetermined width and bonded to inside portions of said conductive bumps on said charge coupled device; and
   a glass lid having a plurality of metal lines on opposite sides of a lower surface thereof and bonded to an upper surface of said insulating tape such that each metal line is electrically connected at one end to a respective one of said conductive bumps and at the other end thereof is adapted to be electrically coupled to a signal terminal of a circuit board.

2. The charge coupled device package with a glass lid according to claim 1, further including sealing resin provided between a lower periphery of the glass lid and an upper surface of said charge coupled device.

3. The charge coupled device package with a glass lid according to claim 1, wherein the glass lid is provided with an anti-reflection layer on an upper surface thereof for prevention of light reflection.

4. A charge coupled device package with a glass lid according to claim 1, further comprising a plurality of outleads which are adapted for signal communication and are connected to outer ends of said metal lines, respectively.

5. A method for manufacturing a charge coupled device package with a glass lid, comprising the steps of:
   (a) forming a plurality of conductive bumps on a plurality of bond pads of a charge coupled device;
   (b) bonding an insulating tape of a predetermined thickness and a predetermined width to inside portions of said conductive bumps on said charge coupled device;
   (c) bonding a glass lid having a plurality of metal lines on opposite sides of a lower surface thereof to an upper surface of said insulating tape; wherein said plurality of metal lines are configured such that each metal line contacts, at one end thereof, one of said conductive bumps and, at the other end thereof, is adapted to be electrically coupled to a signal terminal of a circuit board.

6. A method for manufacturing a charge coupled device package with a glass lid according to claim 5, further comprising the step of providing a sealing part of a sealing resin between a lower periphery of the glass lid and an upper surface of said charge coupled device.

7. A method for manufacturing a charge coupled device package with a glass lid according to claim 5, further comprising the step of providing an anti-reflection layer on an upper surface of the glass lid for preventing light reflection.

8. A method for manufacturing a charge coupled device package with a glass lid according to claim 5, further comprising the step of connecting a plurality of outleads, adapted for signal communication, to outer ends of said metal lines, respectively.

* * * * *